(12) United States Patent
Xia et al.

(10) Patent No.: US 8,570,811 B2
(45) Date of Patent: Oct. 29, 2013

(54) FINFET BASED ONE-TIME PROGRAMMABLE DEVICE AND RELATED METHOD

(75) Inventors: Wei Xia, Irvine, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 241 days.

(21) Appl. No.: 13/219,414

(22) Filed: Aug. 26, 2011

(65) Prior Publication Data

US 2013/0051112 A1 Feb. 28, 2013

(51) Int. Cl.
*G11C 11/34* (2006.01)
(52) U.S. Cl.
USPC ............ 365/185.24; 365/185.14; 365/185.28; 365/185.21
(58) Field of Classification Search
USPC .............. 365/185.24, 185.14, 185.28, 185.21
See application file for complete search history.

(56) References Cited

U.S. PATENT DOCUMENTS 7,352,631 B2 * 4/2008 Burnett et al. ........... 365/185.24

* cited by examiner

*Primary Examiner* — Jason Lappas
(74) *Attorney, Agent, or Firm* — Farjami & Farjami LLP

(57) ABSTRACT

According to one embodiment, a one-time programmable (OTP) device comprises a memory FinFET in parallel with a sensing FinFET. The memory FinFET and the sensing FinFET share a common source region, a common drain region, and a common channel region. The memory FinFET is programmed by having a ruptured gate dielectric, resulting in the sensing FinFET having an altered threshold voltage and an altered drain current. A method for utilizing such an OTP device comprises applying a programming voltage for rupturing the gate dielectric of the memory FinFET thereby achieving a programmed state of the memory FinFET, and detecting by the sensing FinFET the altered threshold voltage and the altered drain current due to the programmed state of the memory FinFET.

20 Claims, 4 Drawing Sheets

FINFET BASED ONE-TIME PROGRAMMABLE DEVICE AND RELATED METHOD

BACKGROUND OF THE INVENTION

1. Field of the Invention

The present invention is generally in the field of semiconductors. More particularly, the present invention is in the field of one-time programmable semiconductor devices.

2. Background Art

One-time programmable (OTP) semiconductor devices are widely used, for example, to allow for post-fabrication design changes in integrated circuits (ICs). For instance, after device fabrication, but prior to commercial distribution, programming of a group of OTP devices embedded in a semiconductor die may be performed to provide a permanent serial number encoding for the die. Alternatively, in some applications a single OTP device may be programmed so as to permanently enable or disable a portion of an IC after device fabrication, and even after distribution of the IC to a customer. Although the functionality enabled by OTP devices is desirable, their conventional implementation is associated with drawbacks arising from added costs due to additional processing steps beyond those required for conventional transistor fabrication, as well as due to the circuit area needed to provide a separate sensing transistor, for example, to detect the programming state of the OTP device.

As a specific example, one conventional approach to implementing an OTP device utilizes a split-channel architecture, where the OTP device includes a laterally extended gate structure having two different gate dielectric thicknesses. The thinner portion of the gate dielectric provides the programming element of the OTP device. This thinner portion of gate dielectric can be made to destructively break down and form a conductive path from the extended gate to the underlying channel, thereby placing the conventional OTP device into a "programmed" state. This approach, however, requires that circuit area be dedicated to the programming element, to the transistor undergoing programming through use of the programming element, and to a separate sensing device for detecting the programmed state of the OTP device. In addition, this approach is substantially incompatible with emergent transistor architectures, such as the fin type field-effect transistor (FinFET) architecture contemplated for use at the 22 nm technology node and beyond.

Thus, there is a need to overcome the drawbacks and deficiencies in the art by providing a compact and reliable OTP device that is also compatible with FinFET fabrication process.

SUMMARY OF THE INVENTION

A FinFET based one-time programmable (OTP) device and related method, substantially as shown in and/or described in connection with at least one of the figures, and as set forth more completely in the claims.

DETAILED DESCRIPTION OF THE INVENTION

Figure 1:
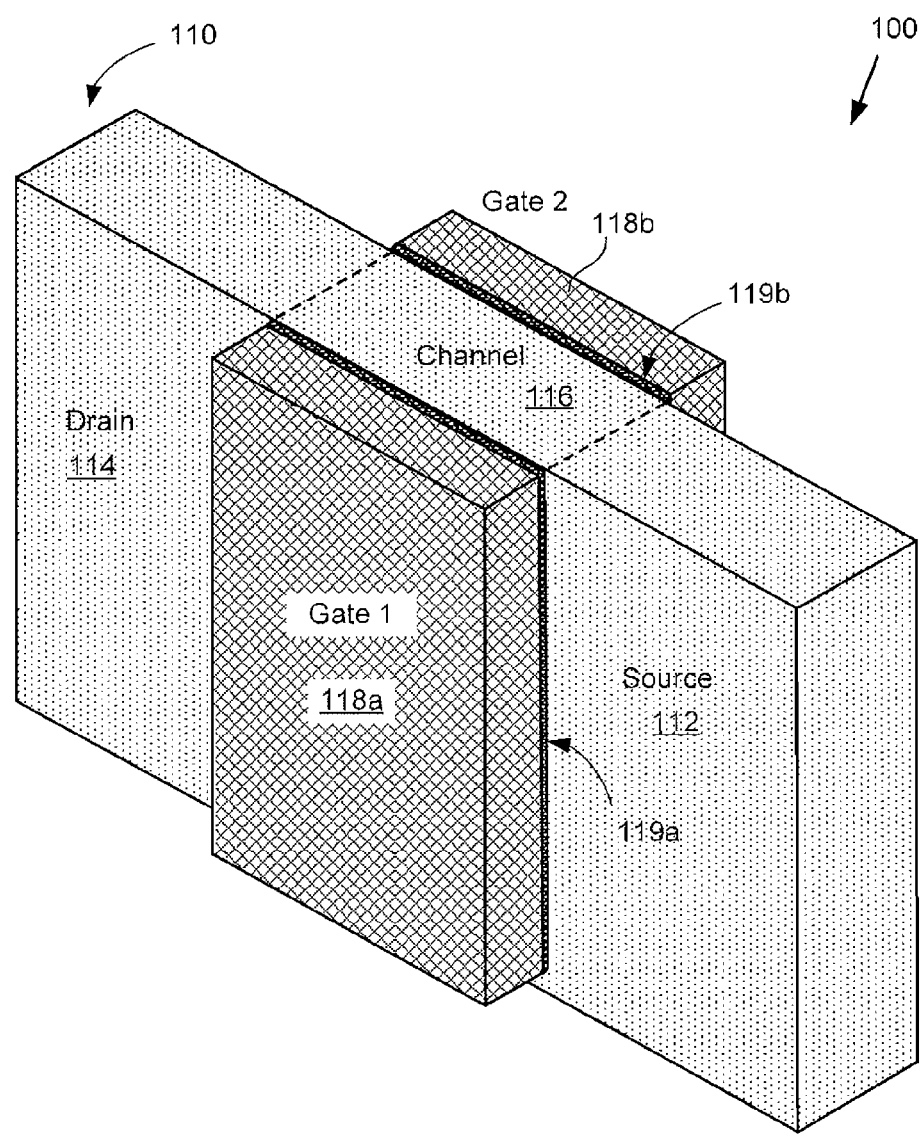
FIG. 1 shows a FinFET based one-time programmable (OTP) device, according to one embodiment of the present invention, prior to programming.

The present invention is directed to a fin type field-effect transistor (FinFET) based one-time programmable (OTP) device and related method. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be understood that unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows FinFET based OTP device 100 capable of overcoming the drawbacks and deficiencies encountered in the conventional art, according to one embodiment of the present invention. As shown in FIG. 1, FinFET based OTP device 100 comprises semiconductor fin 110 including source region 112, drain region 114, and channel region 116. FinFET based OTP device 100 also includes gates 118a and 118b capacitively coupled to channel region 116 through respective gate dielectrics 119a and 119b. As may be understood from examination of FIG. 1, FinFET based OTP device 100 embodies two monolithically integrated FinFET devices, e.g., a first device controlled using gate 118a and a second device controlled using gate 118b, which share source region 112 as a common source region, drain region 114 as a common drain region, and channel region 116 as a common channel region.

FinFET based OTP device 100 may be implemented as a Group IV semiconductor device, such as a silicon or germanium device, for instance, fabricated using a FinFET fabrication process at or below the 22 nm technology node. For example, according to one embodiment, semiconductor fin 110 may be formed as a silicon fin, such as an epitaxial silicon fin, on a surface of a substrate (substrate not shown in FIG. 1), which may also comprise silicon. In such an embodiment, semiconductor fin 110 may be formed using masking and etching process steps known in the art. Semiconductor fin 110 may be appropriately doped to form source region 112 and drain region 114. Although no particular doping regime is depicted in FIG. 1, it is to be understood that FinFET based OTP device 100 can be suitably constituted and doped to provide either N type or P type devices (NFETs or PFETs, respectively) controlled using gates 118a and 118b.

Gates 118a and 118b may comprise doped polysilicon gates, for example, and may both be capacitively coupled to channel region 116 through respective gate dielectrics 119a and 119b prior to programming of FinFET based OTP device 100, as represented in FIG. 1. Gate dielectrics 119a and 119b may comprise silicon, and may be implemented as silicon oxide ($SiO_2$) or silicon nitride ($Si_3N_4$) gate dielectrics, for example. Alternatively, gate dielectrics 119a and 119b may comprise high-K dielectrics, such as hafnium oxide ($HfO_2$), zirconium oxide ($ZrO_2$), or the like, while gates 118a and 118b may comprise gate metal. For example, in embodiments in which FinFET based OTP device 100 is implemented using N type FinFETs, gates 118a and 118b may be selected from any gate metal suitable for use in an NFET device, such as tantalum (Ta), tantalum nitride (TaN), or titanium nitride (TiN), for example. Moreover, in embodiments in which FinFET based OTP device 100 is implemented using P type FinFETs, gates 118a and 118b may be selected from any gate metal suitable for use in a PFET device, such as molybdenum (Mo), ruthenium (Ru), or tantalum carbide nitride (TaCN), for example.

Figure 2A:
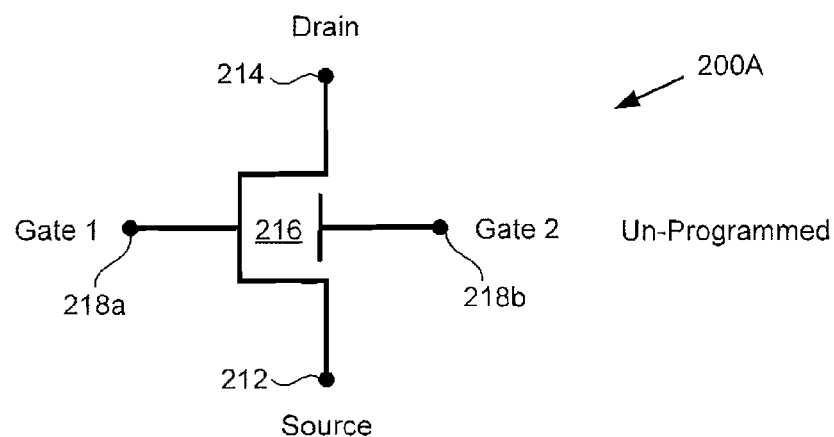
FIG. 2A shows a conceptual circuit representation of the exemplary FinFET based OTP device of FIG. 1, according to one embodiment of the present invention.

Referring to FIG. 2A, FIG. 2A shows conceptual circuit 200A corresponding to FinFET based OTP device 100, in FIG. 1, prior to programming, e.g., FinFET based OTP device 100 in an un-programmed state, as depicted in FIG. 1, according to one embodiment of the present invention. As shown in FIG. 2A, conceptual circuit 200A includes source node 212, drain node 214, channel region 216, and gates 218a and 218b, corresponding respectively to shared common source region 112, common drain region 114, common channel region 116, and gates 118a and 118b, of FinFET based OTP device 100 in FIG. 1. As may be apparent from FIGS. 1 and 2A, prior to programming, FinFET based OTP device 100 is symmetrical with respect to the FinFET devices controlled by gates 118a and 118b. In other words, prior to programming of FinFET based OTP device 100, the FinFET controlled by either of gates 118a and 118b may be implemented as a programmed memory cell, while the other FinFET may be used to sense the programming state of the memory cell.

Figure 2B:
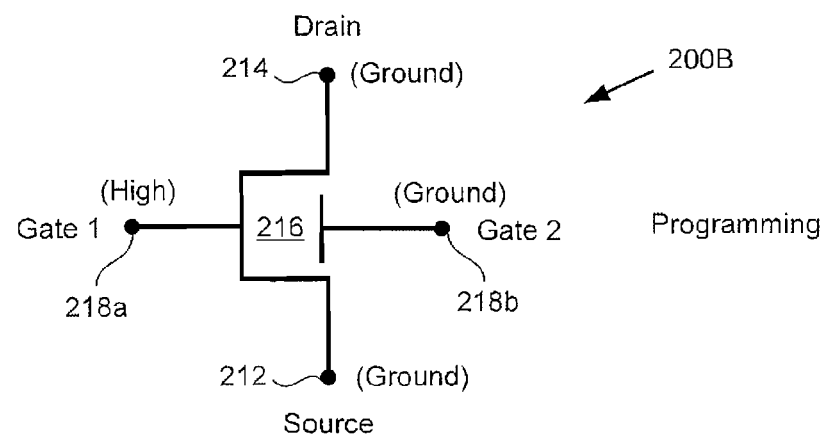
FIG. 2B shows a conceptual circuit representation corresponding to programming conditions for the FinFET based OTP device of FIG. 1, according to one embodiment of the present invention.
Figure 2C:
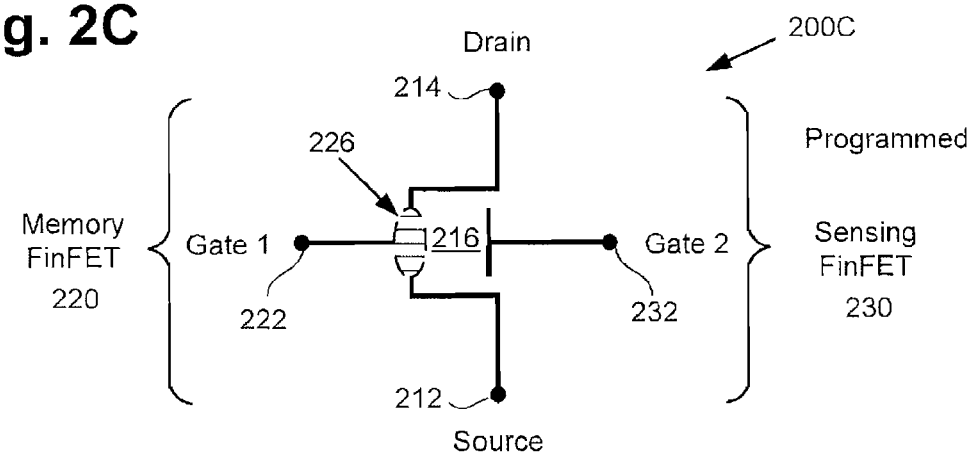
FIG. 2C shows a conceptual circuit representation corresponding to a programmed FinFET based OTP device, according to one embodiment of the present invention.
Figure 3:
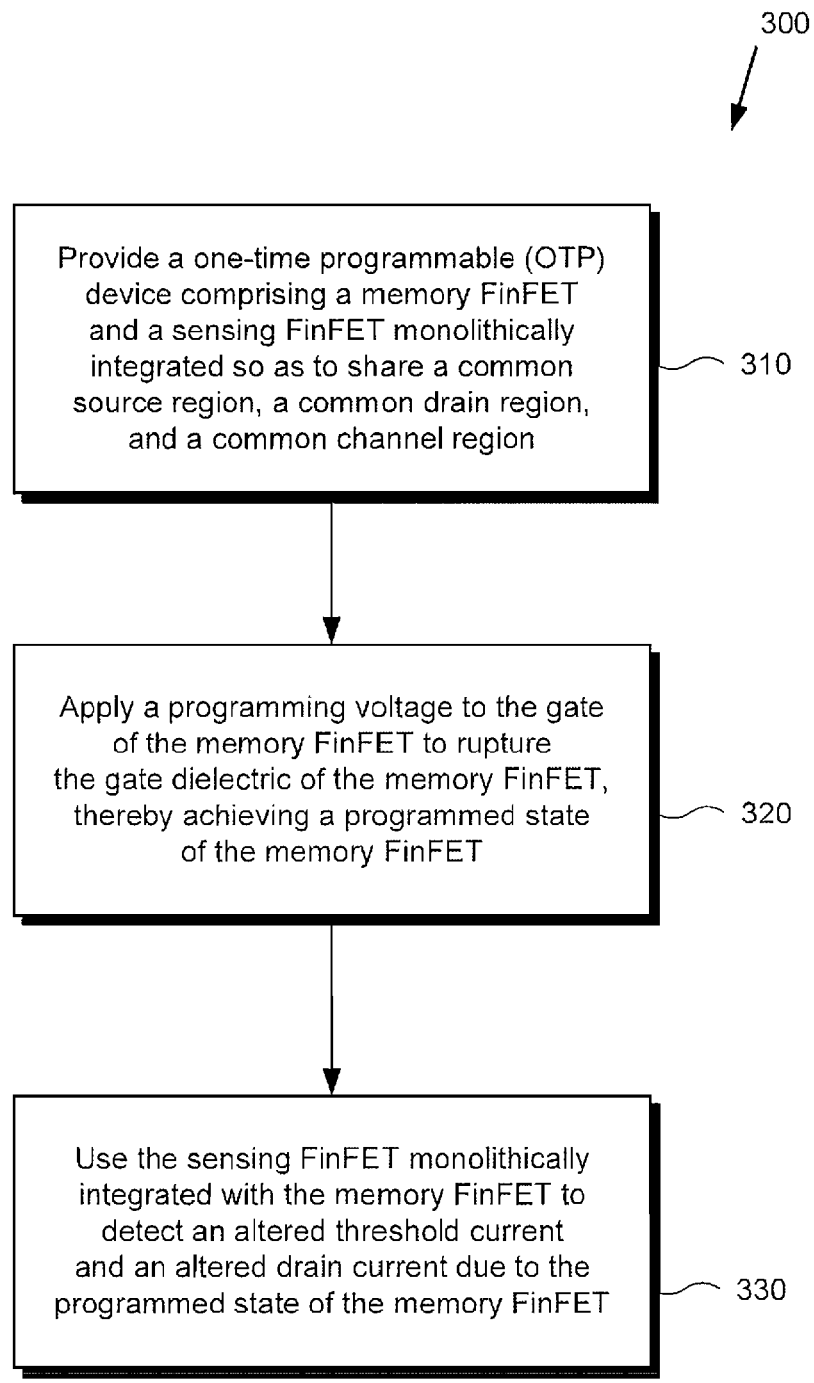
FIG. 3 is a flowchart showing a method for utilizing a FinFET based OTP device, according to one embodiment of the present invention.
Figure 4:
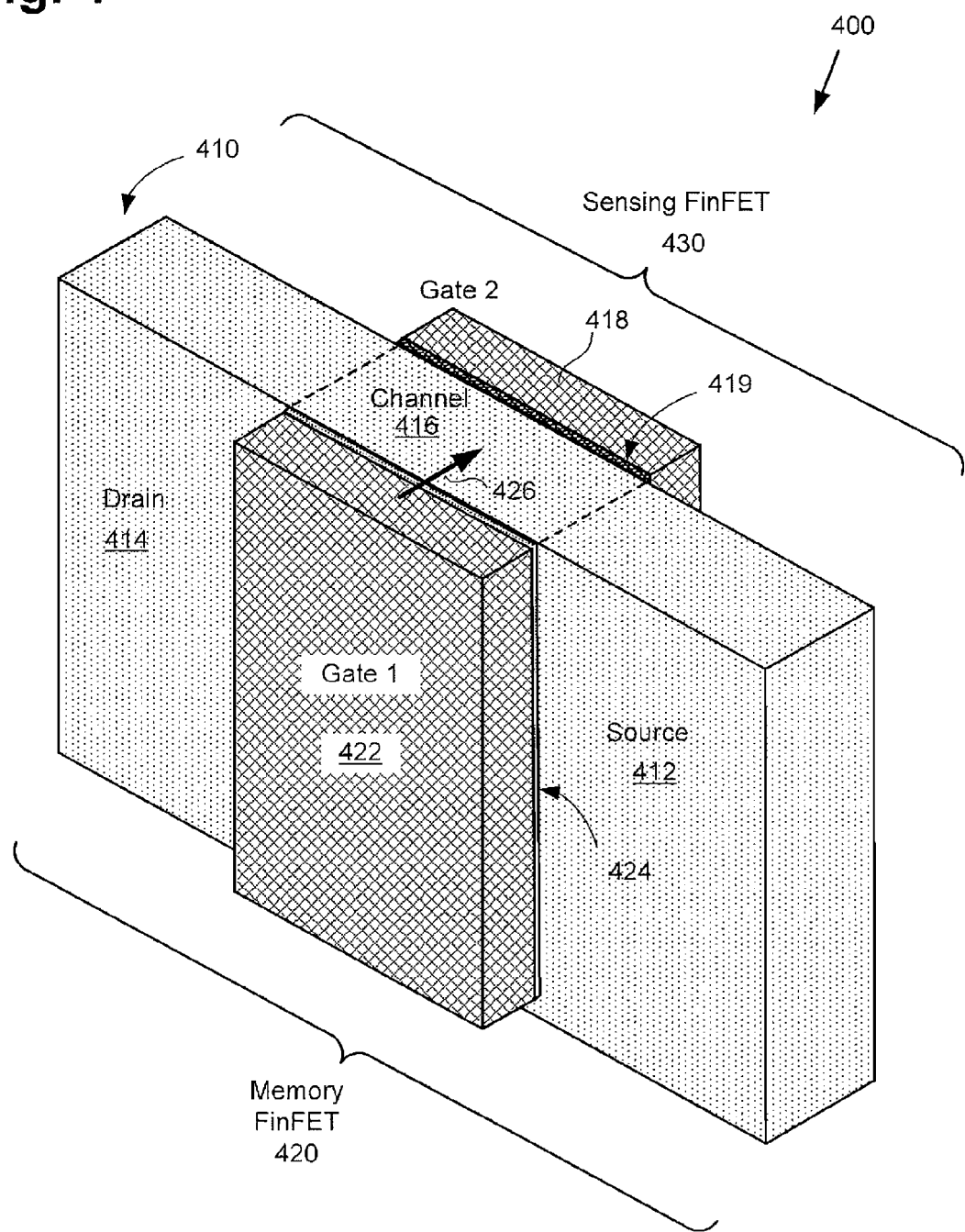
FIG. 4 shows a programmed FinFET based OTP device corresponding to the conceptual circuit representation of FIG. 2C, according to one embodiment of the present invention.

The use of FinFET based OTP device 100 will be further described in combination with FIGS. 2B, 2C, 3, and 4. FIG. 2B shows a conceptual circuit representation corresponding to example programming conditions for FinFET based OTP device 100, while FIG. 2C shows a conceptual circuit representation corresponding to FinFET based OTP device 100 after programming, according to one embodiment of the present invention. Moreover, FIG. 4 shows programmed FinFET based OTP device 400 corresponding to the conceptual circuit representation of FIG. 2C, according to one embodiment of the present invention.

FIG. 3 presents a flowchart setting forth a method for utilizing a two-FinFET OTP device, such as FinFET based OTP device 100, in FIG. 1, according to one embodiment of the present invention. Certain details and features have been left out of flowchart 300 that are apparent to a person of ordinary skill in the art. For example, a step may consist of one or more substeps or may involve specialized equipment or materials, as known in the art. Although steps 310 through 330 indicated in flowchart 300 are sufficient to describe one embodiment of the present invention, other embodiments of the invention may utilize steps different from those shown in flowchart 300, or may comprise more, or fewer, steps.

Referring to step 310 in FIG. 3 and FinFET based OTP device 100 in FIG. 1, step 310 of flowchart 300 comprises providing FinFET based OTP device 100 comprising a memory FinFET and a sensing FinFET monolithically integrated so as to share common source region 112, common drain region 114, and common channel region 116. As discussed above, due to the symmetry of FinFET based OTP device 100 prior to programming, either of the FinFETs controlled using gates 118a or 118b may be designated for use as the memory FinFET, while the other may be used as the sensing FinFET for detecting the programming state of Fin-FET based OTP device 100. According to the embodiment shown in FIGS. 1 and 2A, FinFET based OTP device 100 is a two-FinFET OTP structure implemented as a four terminal device, e.g., terminals corresponding to common source node 212, common drain node 214, and each of gates 218a and 218b.

Moving to step 320 in FIG. 3 with reference to conceptual circuit representations 200B and 200C in respective FIGS. 2B and 2C, and FinFET based OTP device 400 in FIG. 4, step 320 of flowchart 300 comprises applying a programming voltage to the gate of the FinFET designated as the memory FinFET to rupture its gate dielectric, thereby achieving a programmed state of the memory FinFET. Although, as explained above, either of the FinFETs controlled using gates 218a or 218b may be designated for use as the memory FinFET, in the embodiment of the present invention represented in FIG. 2B, the FinFET controlled using gate 218a has been selected for programming as the memory FinFET. As shown in FIG. 2B, application of a programming voltage to gate 218a, in step 320, may be performed by applying a relatively high voltage, such as an approximately 5V programming voltage, for example, to gate 218a, while concurrently grounding common source node 212, common drain node 214, and gate 218b of the FinFET designated as the sensing device.

The result of performing step 320 of flowchart 300 is shown by FIGS. 2C and 4. Referring to FIG. 2C, the programming step depicted in FIG. 2B results in production of a functionally asymmetrical FinFET based OTP structure comprising memory FinFET 220 including gate 222 having a ruptured gate dielectric (represented in FIG. 2C as rupture 226), monolithically integrated with sensing FinFET 230 controlled by gate 232 having a substantially intact gate dielectric. Referring now to FIG. 4, FIG. 4 shows programmed FinFET based OTP device 400 corresponding to conceptual circuit representation 200C, according to one embodiment of the present invention. As may be apparent from comparison of FIG. 1 and FIG. 4, FinFET based OTP device 400 may be seen to result from performance of step 320, of flowchart 300, on FinFET based OTP device 100, shown in FIG. 1.

FinFET based OTP device 400 comprises semiconductor fin 410 including shared common source region 412, common drain region 414, and common channel region 416. Semiconductor fin 410 including shared common source region 412, common drain region 414, and common channel region 416 corresponds to semiconductor fin 110 including shared common source region 112, common drain region 114, and common channel region 116, in FIG. 1. FinFET based OTP device 400, in FIG. 4, also includes gate 418 and gate dielectric 419 corresponding to gate 118b and gate dielectric 119b, in FIG. 1.

As shown in FIG. 4, the FinFET controlled using gate 418 capacitively coupled to common channel region 416 at one side of semiconductor fin 410 is now identified as sensing FinFET 430 of FinFET based OTP device 400. As further shown in FIG. 4, gate 422 of programmed memory FinFET 420 is coupled to common channel region 416 at another side of semiconductor fin 410 opposite the side of semiconductor fin 410 coupled to gate 418. In other words, FinFET based OTP device 400 includes memory FinFET 420 in parallel with sensing FinFET 430, wherein memory FinFET 420 and sensing FinFET 430 share common source region 412, common drain region 414, and common channel region 416.

Due to programming of FinFET based OTP device 400, gate 422 of memory FinFET 420 is ohmically coupled to common channel region 416 through rupture 426 in ruptured gate dielectric 424. Moreover, due to the relative isolation of gate dielectric 419 from the interface of ruptured gate dielectric 424 and common channel region 416, resulting from gates 418 and 422 being formed at opposite sides of semiconductor fin 410, gate dielectric 419 will remain substantially unaffected by the application of the programming voltage causing rupture 426 in ruptured gate dielectric 424.

As discussed above, in one embodiment, gate dielectric 419 and ruptured gate dielectric 424 may comprise a silicon containing dielectric such as $SiO_2$ or $Si_3N_4$, while sensing Fin FET gate 418 and memory FinFET gate 422 may comprise doped polysilicon, for example. Alternatively, in other embodiments, one or both of gate dielectric 419 and ruptured gate dielectric 424 may comprise high-κ dielectrics, such as $HfO_2$, $ZrO_2$, or the like. Moreover, and depending upon whether FinFET based OTP device 400 is implemented as an NFET or PFET device, when ruptured gate dielectric 424 comprises a high-κ dielectric, memory FinFET gate 422 may comprise a gate metal such as Ta, TaN, TiN, Mo, Ru, or TaCN, for example.

Proceeding to step 330 in FIG. 3 with continued reference to FinFET based OTP device 400, in FIG. 4, step 330 of flowchart 300 comprises using sensing FinFET 430 to detect the programming state of memory FinFET 420. When programmed as described in step 320, ohmic coupling of gate 422 of memory FinFET 420 to common channel region 416 through ruptured gate dielectric 424 will cause sensing FinFET 430 to have an altered threshold voltage and drain current when compared to a comparable FinFET structure in an un-programmed state, such as either of the FinFETs controlled using gates 118a and 118b of FinFET based OTP device 100, in FIG. 1. As a result, the altered threshold voltage and/or altered drain current of sensing FinFET 430 may be used as a detection criteria for identifying the programming state of FinFET based OTP device 400. In other words, embodiments of the present invention advantageously enable self-sensing by FinFET based OTP device 400 through use of sensing FinFET 430 to detect the programming state of memory FinFET 420, with which sensing FinFET 430 is monolithically integrated.

Thus, by monolithically integrating a memory device and a sensing device sharing a common source region, common drain region, and common channel region, the present application discloses a highly compact OTP device design. In addition, by situating the gate dielectric of a memory device used as a programming element of the OTP device opposite from a control gate of the monolithically integrated sensing device, the present application discloses a robust and reliable OTP device configured to avoid damage to the sensing device during programming. Moreover, by implementing the OTP device using a FinFET architecture, the present application discloses an OTP device that is not only compatible with FinFET fabrication processes at the 22 nm technology node, but one that can advantageously be fabricated without substantial additional processing steps beyond those required for fabrication of ordinary FinFET transistors at 22 nm. Furthermore, the embodiments of a FinFET based OTP device disclosed herein are contemplated to advantageously scale with advances in fabrication processes below the 22 nm technology node.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A one-time programmable (OTP) device comprising:
   a memory FinFET in parallel with a sensing FinFET, wherein said memory FinFET and said sensing FinFET share a common source region, a common drain region, and a common channel region;
   said memory FinFET being programmed by having a ruptured gate dielectric;
   said sensing FinFET thereby having an altered threshold voltage and an altered drain current due to said memory FinFET being programmed.

2. The OTP device of claim 1, wherein said OTP device is implemented as a four terminal device.

3. The OTP device of claim 1, wherein said memory FinFET and said sensing FinFET are implemented as monolithically integrated silicon FinFETs.

4. The OTP device of claim 1, wherein a gate of said memory FinFET and another gate of said sensing FinFET are coupled to said common channel region at opposite sides of a semiconductor fin of said OTP device, said semiconductor fin including said common source region, said common drain region, and said common channel region.

5. The OTP device of claim 1, wherein said OTP device is fabricated using a FinFET fabrication process at or below a 22 nm technology node.

6. The OTP device of claim 1, wherein a gate of said memory FinFET is ohmically coupled to said common channel region through said ruptured gate dielectric.

7. The OTP device of claim 1, wherein said ruptured gate dielectric comprises silicon oxide.

8. The OTP device of claim 1, wherein said ruptured gate dielectric comprises a high-κ dielectric.

9. The OTP device of claim 1, wherein a gate of said memory FinFET comprises polysilicon.

10. The OTP device of claim 1, wherein a gate of said memory FinFET comprises a gate metal.

11. A method for utilizing a two-FinFET one-time programmable (OTP) device, said two-FinFET OTP device comprising a memory FinFET in parallel with a sensing FinFET, wherein said memory FinFET and said sensing FinFET share a common source region, a common drain region, and a common channel region, said method comprising:
   applying a programming voltage for rupturing a gate dielectric of said memory FinFET, thereby achieving a programmed state of said memory FinFET;
   detecting by said sensing FinFET an altered threshold voltage and an altered drain current due to said programmed state of said memory FinFET.

12. The method of claim 11, wherein said two-FinFET OTP device is implemented as a four terminal device.

13. The method of claim 11, wherein said memory FinFET and said sensing FinFET are implemented as monolithically integrated silicon FinFETs.

14. The method of claim 11, wherein a gate of said memory FinFET and another gate of said sensing FinFET are coupled to said common channel region at opposite sides of a semiconductor fin of said two-FinFET OTP device, said semiconductor fin including said common source region, said common drain region, and said common channel region.

15. The method of claim 11, wherein fabrication of said two-FinFET OTP device is performed using a FinFET fabrication process at or below the 22 nm technology node.

16. The method of claim 11, wherein achieving said programmed state of said memory FinFET results in a gate of said memory FinFET being ohmically coupled to said common channel region after said rupturing said gate dielectric.

17. The method of claim 11, wherein said gate dielectric comprises silicon oxide.

18. The method of claim 11, wherein said gate dielectric comprises a high-κ dielectric.

19. The method of claim 11, wherein a gate of said memory FinFET comprises polysilicon.

20. The method of claim 11, wherein a gate of said memory FinFET comprises a gate metal.

* * * * *